(12) United States Patent
Lee

(10) Patent No.: US 10,878,909 B2
(45) Date of Patent: Dec. 29, 2020

(54) SEMICONDUCTOR DEVICE, MEMORY SYSTEM, AND OPERATING METHOD OF SEMICONDUCTOR DEVICE

(71) Applicant: SK hynix Inc., Gyeonggi-do (KR)

(72) Inventor: Un Sang Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/511,559

(22) Filed: Jul. 15, 2019

(65) Prior Publication Data
US 2020/0202936 A1 Jun. 25, 2020

(30) Foreign Application Priority Data
Dec. 21, 2018 (KR) .................. 10-2018-0167756

(51) Int. Cl.
| | |
|---|---|
| G11C 16/08 | (2006.01) |
| G11C 16/10 | (2006.01) |
| G11C 16/30 | (2006.01) |
| G11C 7/10 | (2006.01) |
| G06F 12/02 | (2006.01) |

(52) U.S. Cl.
CPC .......... *G11C 16/08* (2013.01); *G06F 12/0246* (2013.01); *G06F 12/0253* (2013.01); *G11C 7/109* (2013.01); *G11C 16/10* (2013.01); *G11C 16/30* (2013.01)

(58) Field of Classification Search
CPC ......... G11C 16/08; G11C 7/109; G11C 16/10; G11C 2211/5641; G11C 16/0483; G11C 7/14; G11C 8/08; G11C 8/14
See application file for complete search history.

(56) References Cited

U.S. PATENT DOCUMENTS

| | | | | |
|---|---|---|---|---|
| 7,978,522 | B2 * | 7/2011 | Kang | .................. G11C 11/5628 |
| | | | | 365/185.2 |
| 8,804,417 | B2 * | 8/2014 | Park | .................. G11C 16/3418 |
| | | | | 365/185.02 |
| 9,286,994 | B1 * | 3/2016 | Chen | .................. G11C 16/0483 |
| 9,349,465 | B2 * | 5/2016 | Jang | .................. G11C 16/3427 |
| 10,008,271 | B1 * | 6/2018 | Diep | .................. G11C 11/5642 |

FOREIGN PATENT DOCUMENTS

| | | |
|---|---|---|
| KR | 10-2013-0095964 | 8/2013 |
| KR | 10-2015-0014906 | 2/2015 |
| KR | 10-1642930 | 7/2016 |

* cited by examiner

*Primary Examiner* — Gene N Auduong
(74) *Attorney, Agent, or Firm* — IP & T Group LLP

(57) ABSTRACT

A semiconductor device includes: a memory string including a plurality of memory cells, a plurality of select transistors, and one or more dummy transistors coupled between the plurality of memory cells and the plurality of select transistors; one or more dummy word lines coupled to the one or more dummy transistors; and a plurality of select lines respectively coupled to the plurality of select transistors. When a program voltage is applied to a selected dummy word line among the one or more dummy word lines, a first dummy word line voltage may be applied to a select line adjacent to the one or more dummy word lines, among the plurality of select lines.

19 Claims, 13 Drawing Sheets

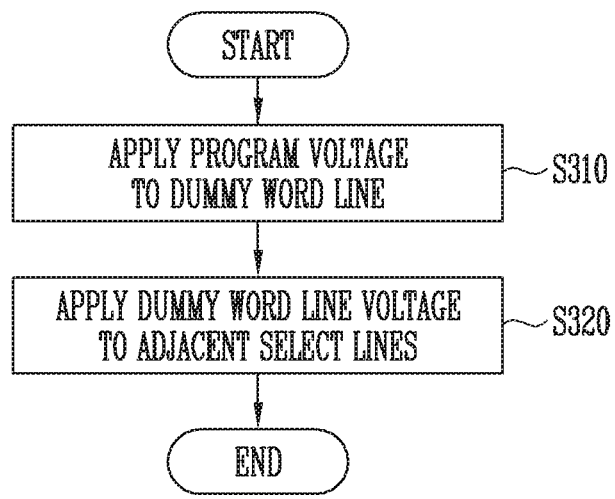
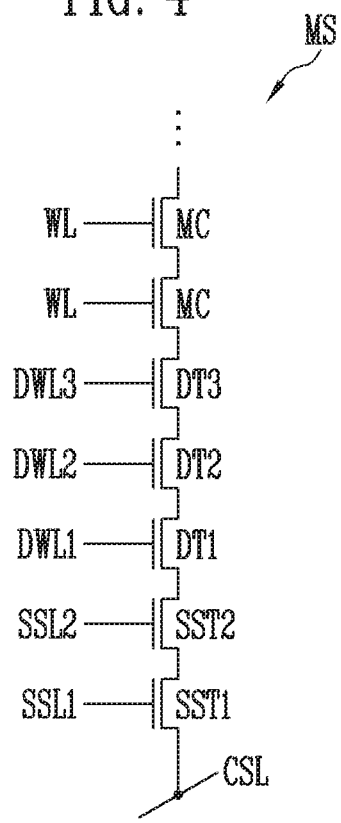

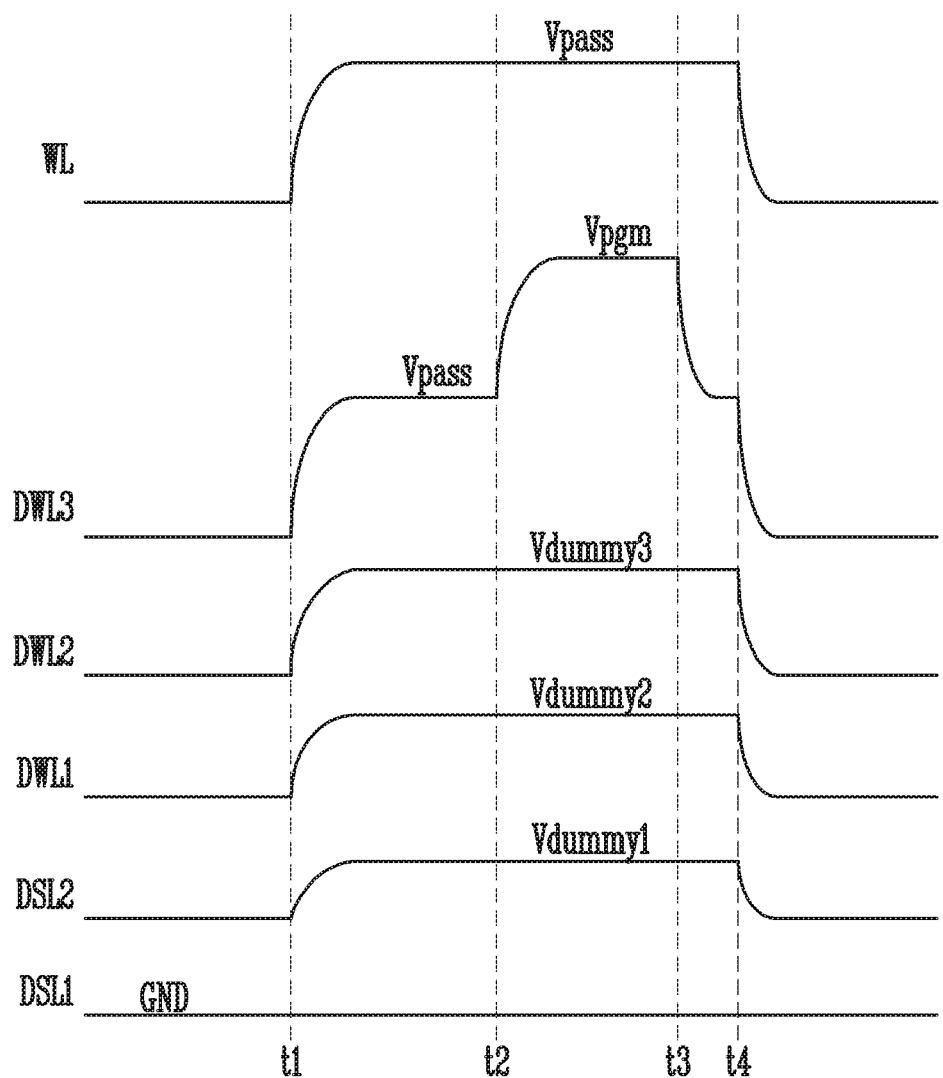

SEMICONDUCTOR DEVICE, MEMORY SYSTEM, AND OPERATING METHOD OF SEMICONDUCTOR DEVICE

CROSS-REFERENCE TO RELATED APPLICATION

The present application claims priority under 35 U.S.C. § 119(a) to Korean patent application number 10-2018-0167756, filed on Dec. 21, 2018, which is incorporated herein by reference in its entirety.

BACKGROUND

Field of Invention

The present disclosure generally relates to an electronic device, and more particularly, to a semiconductor device, a memory system, and an operating method of the semiconductor device.

Description of Related Art

A semiconductor memory system is a storage device implemented using a semiconductor such as silicon (Si), germanium (Ge), gallium arsenide (GaAs), or indium phosphide (InP). The semiconductor memory system may be generally classified into a volatile memory device and a nonvolatile memory device.

The volatile memory device is a memory device in which stored data is lost when the supply of power is interrupted. Examples of the volatile memory device include a static random access memory (SRAM), a dynamic RAM (DRAM), a synchronous DRAM (SDRAM), and the like. The nonvolatile memory device is a memory device in which stored data is retained even when the supply of power is interrupted. Examples of the nonvolatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a semiconductor device having an increased capacity per memory block, a memory system, and an operating method of the semiconductor device.

According to an aspect of the present disclosure, there is provided a semiconductor device including: a memory string including a plurality of memory cells, a plurality of select transistors, and one or more dummy transistors coupled between the plurality of memory cells and the plurality of select transistors; one or more dummy word lines coupled to the one or more dummy transistors; and a plurality of select lines respectively coupled to the plurality of select transistors, wherein, when a program voltage is applied to a selected dummy word line among the one or more dummy word lines, a first dummy word line voltage is applied to a select line adjacent to the one or more dummy word lines, among the plurality of select lines.

According to another aspect of the present disclosure, there is provided a method for operating a semiconductor device including a plurality of memory cells, a plurality of select transistors, and a plurality of dummy transistors coupled between the plurality of memory cells and the plurality of select transistors, the method including: applying a program voltage to a selected dummy word line among a plurality of dummy word lines respectively coupled to the plurality of dummy transistors; and applying a first dummy word line voltage to a select line adjacent to the plurality of dummy word lines, among the plurality of select lines.

According to still another aspect of the present disclosure, there is provided a memory system including: a memory device including a memory string including a plurality of memory cells, a plurality of select transistors, and one or more dummy transistors coupled between the plurality of memory cells and the plurality of select transistors, a plurality of word lines respectively coupled to the plurality of memory cells, one or more dummy word lines coupled to the one or more dummy transistors, and a plurality of select lines respectively coupled to the plurality of select transistors; and a controller configured to, in a program operation, control the memory device to apply a program voltage to a selected dummy word line among the one or more dummy word lines, and apply a first dummy word line voltage to a select line adjacent to the one or more dummy word lines, among the plurality of select lines.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 3 is a flowchart illustrating an operating method of a semiconductor device according to an embodiment of the present disclosure.

FIG. 4 is a diagram illustrating a portion of a memory string of a semiconductor device according to an embodiment of the present disclosure.

FIGS. 7A and 7B are diagrams illustrating waveforms of pulses used in a program operation.

DETAILED DESCRIPTION

Hereinafter, embodiments according to the present disclosure will be described in detail with reference to the accompanying drawings. In the following description, it should be noted that only a portion required to understand the operation according to the present disclosure will be described, and the description of the remaining portion will be omitted not to obscure the gist of the present disclosure.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

It is noted that reference to "an embodiment," "another embodiment" or the like does not necessarily mean only one embodiment, and different references to any such phrase are not necessarily to the same embodiment(s).

Hereinafter, the various embodiments of the present invention will be described in detail with reference to the attached drawings.

Figure 1:
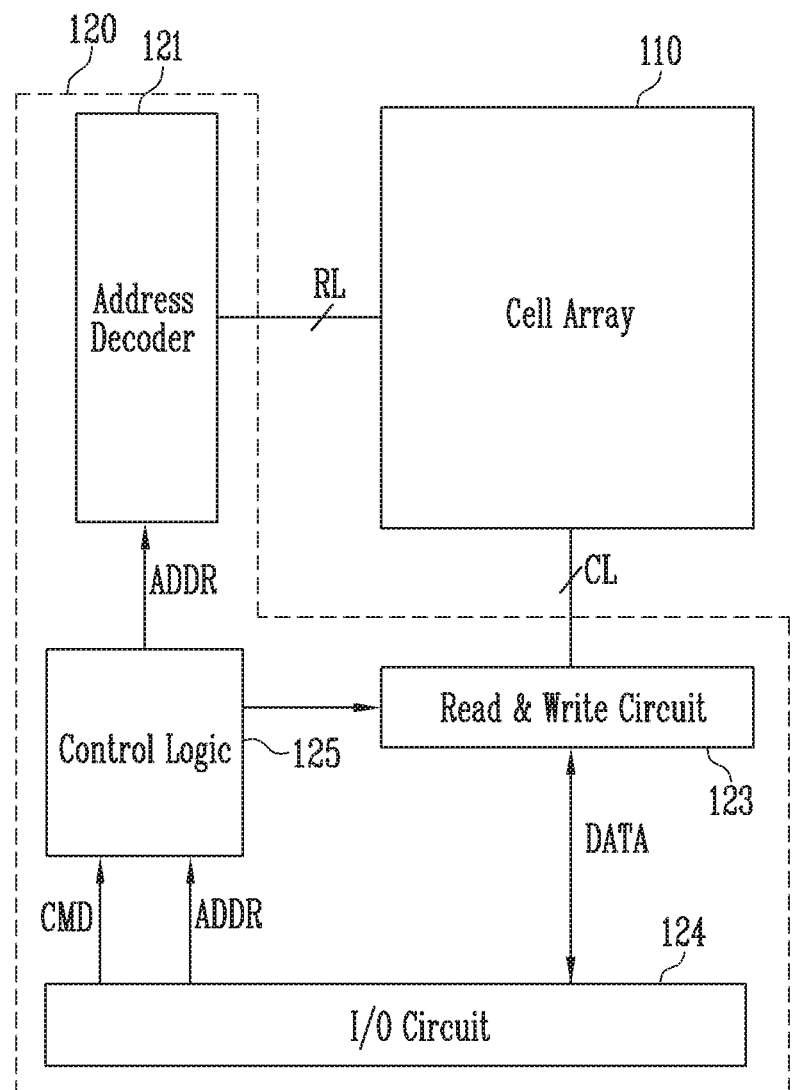
FIG. 1 is a block diagram illustrating a semiconductor device according to an embodiment of the present disclosure.

FIG. 1 is a block diagram illustrating a semiconductor device 100 according to an embodiment of the present disclosure.

Referring to FIG. 1, the semiconductor device 100 includes a cell array 110 and a peripheral circuit 120. According to an embodiment, the peripheral circuit 120 may include an address decoder 121, a read and write (read & write) circuit 123, an input and output (input/output) (I/O) circuit 124, and a control logic 125.

The cell array 110 is coupled to the address decoder 121 through row lines RL, and is coupled to the read & write circuit 123 through column lines CL. The row lines RL may be word lines, and the column lines CL may be bit lines. However, the word lines and the bit lines are relative concepts. For example, the row lines may be bit lines and the column lines may be word lines.

The cell array 110 includes a plurality of memory strings, and the memory strings may be arranged in a horizontal direction or vertical direction on a substrate. Also, the cell array 110 includes a plurality of memory blocks, and each of the memory blocks includes a plurality of pages. For example, the semiconductor device 100 performs an erase operation in units of memory blocks, and performs a program operation or read operation in units of pages.

The control logic 125 may be coupled to the address decoder 121, the read & write circuit 123, and the I/O circuit 124. The control logic 125 may receive a command CMD and an address ADDR from the I/O circuit 124, and control the address decoder 121 and the read & write circuit 123 to perform an internal operation according to the received command CMD.

The address decoder 121 may be coupled to the cell array 110 through the row lines RL. For example, the address decoder 121 may be coupled to the cell array 110 through a word line, a dummy word line, a source select line, and a drain select line. Also, the address decoder 121 may be configured to control the row lines RL under the control of the control logic 125. Therefore, the address decoder 121 may receive an address ADDR from the control logic 125, and select any one of the memory blocks of the cell array 110 according to the received address ADDR.

Program and read operations of the semiconductor device 100 may be performed in units of pages. Therefore, in the program and read operations, the address ADDR may include a block address and a row address. The address decoder 121 may decode the block address in the received address ADDR, and select one memory block according to the decoded block address. The address decoder 121 may decode the row address in the received address ADDR, and select any one page of the selected memory block according to the decoded row address.

An erase operation of the semiconductor device 100 may be performed in units of memory blocks. Therefore, in the erase operation, the address ADDR includes a block address. The address decoder 121 may decode the block address and select one memory block according to the decoded block address.

The read & write circuit 123 is coupled to the memory cell array 110 through the column lines CL. In a program operation, the read & write circuit 123 transfers data DATA received from the I/O circuit 124 to the column lines CL, and memory cells of a selected page are programmed according to the transferred data DATA. The data DATA may be multi-bit data to be respectively programmed in the memory cells. In a read operation, the read & write circuit 123 reads data DATA from memory cells of a selected page through the column lines CL, and outputs the read data DATA to the I/O circuit 124. In an erase operation, the read & write circuit 123 may float the column lines CL. A verify operation may be included in the program operation and/or the erase operation. The verify operation may be performed in a manner similar to that of the read operation.

According to the embodiment described above, memory cells may be programmed using a single level cell (SLC) scheme or multi-level cell (MLC) scheme. In various embodiments, the control logic 125 may control the semiconductor device 100 to perform a program operation, using a multi-step scheme. The multi-step scheme is a scheme in which the program operation is performed plural times so as to implement a desired program state. For example, the multi-step scheme may include a pre and/or main program scheme, a reprogram scheme, and a shadow program scheme.

In various embodiments, the control logic 125 may control the semiconductor device 100 to program real data not only in a memory cell but also to a dummy transistor coupled to a dummy word line. The real data is a data which is generally programmed to and read from the memory cell. Thus, the real data is different from dummy data. The dummy data may be programmed to the dummy transistor for some reasons such as adjusting a threshold voltage of the dummy transistor or etc. However, the dummy data may not be read from the dummy transistor. When a program voltage is applied to a dummy word line, the control logic 125 may control the semiconductor device 100 to apply a dummy word line voltage to a select line adjacent to the dummy word line among a plurality of select lines.

According to this control method of the control logic 125 above, the data storage capacity of each memory block may be increased. Thus, the manufacturing cost of the semiconductor device 100 may be reduced.

Figure 2A:
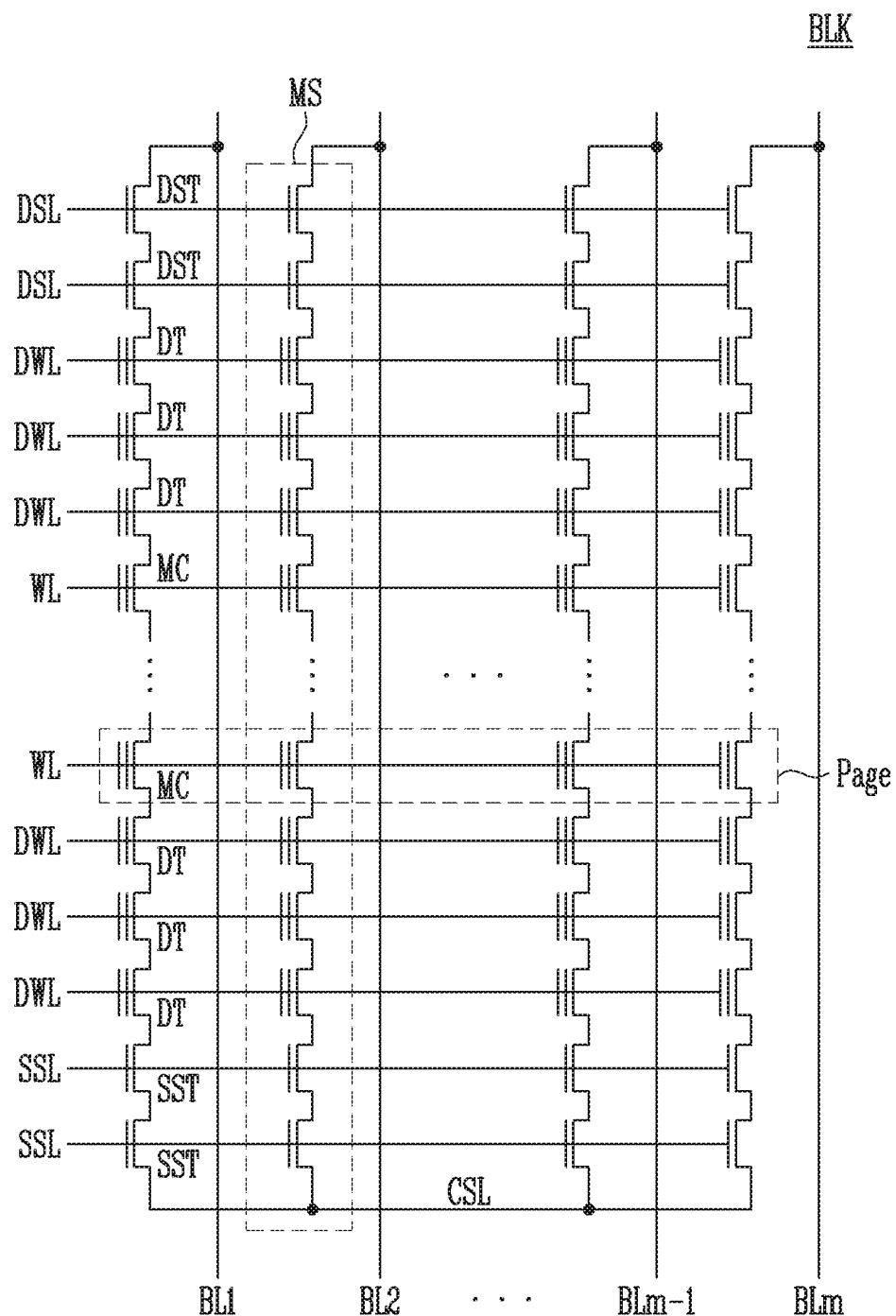
FIGS. 2A to 2C are circuit diagrams illustrating a cell array structure of a semiconductor device according to an embodiment of the present disclosure.
Figure 2B:
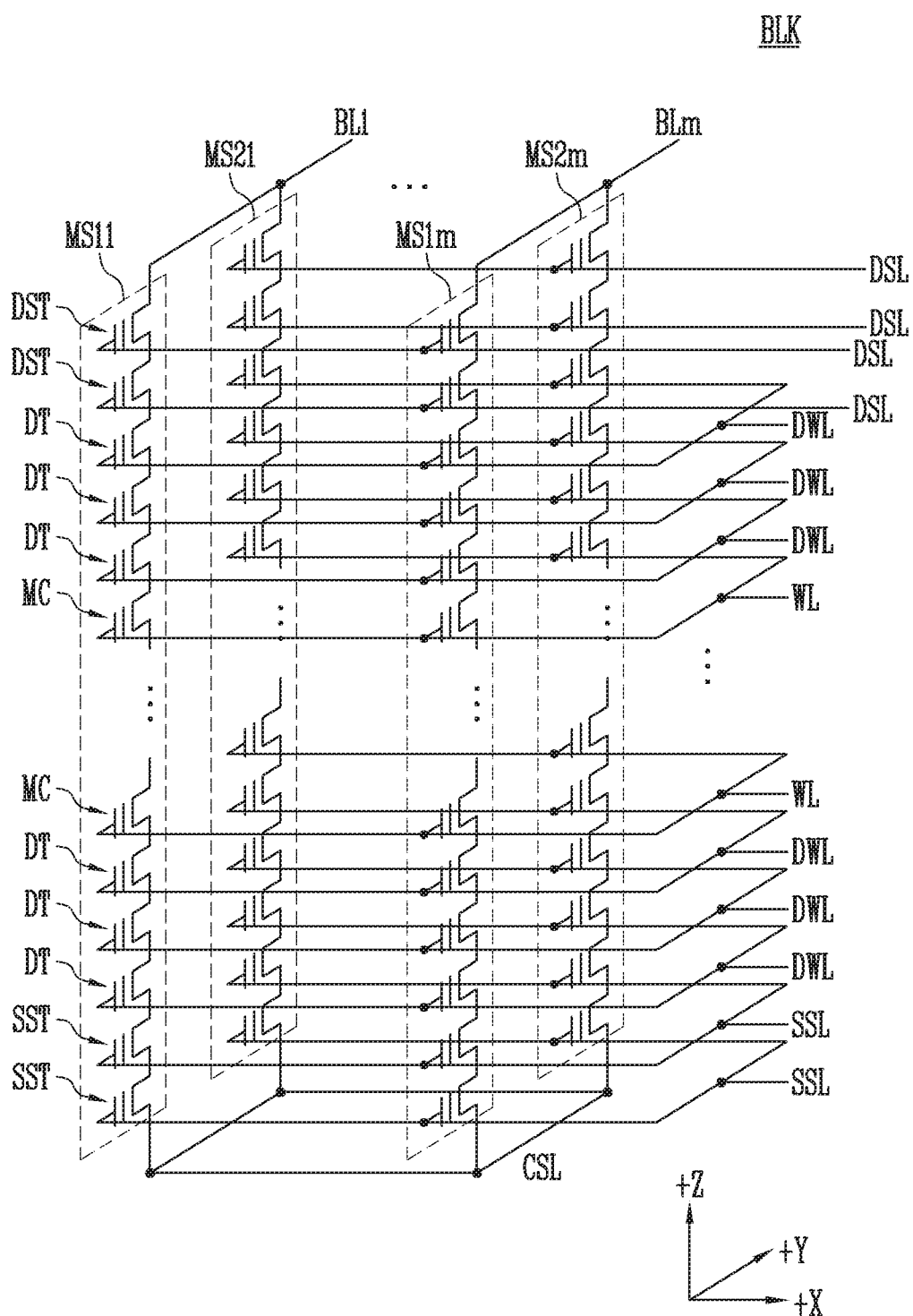
Figure 2C:
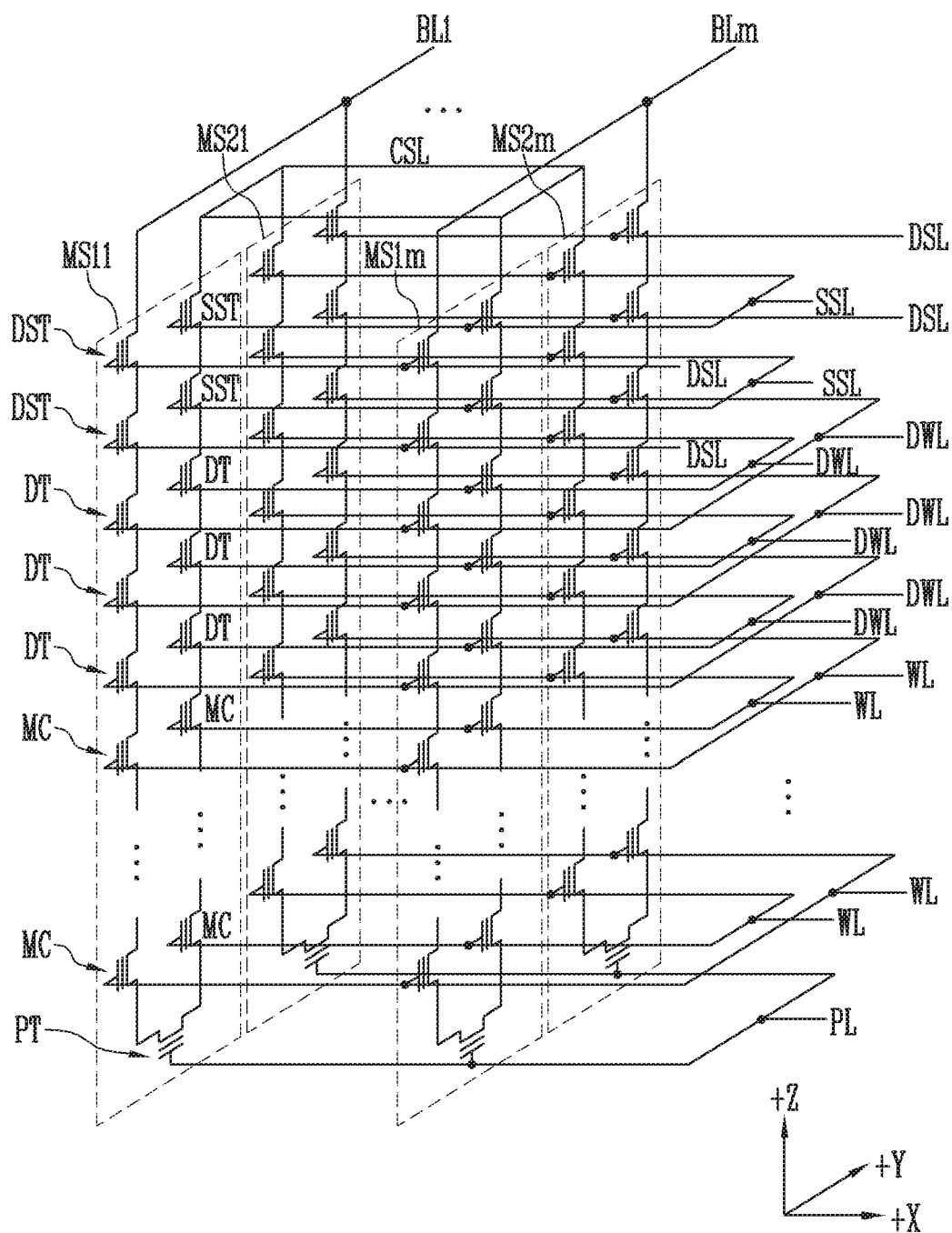

FIGS. 2A to 2C are circuit diagrams illustrating a cell array structure of a semiconductor device according to an embodiment of the present disclosure, for example, the semiconductor device of FIG. 1.

FIG. 2A illustrates an embodiment in which memory strings MS are two-dimensionally arranged. A cell array may include a plurality of memory blocks, and each memory block BLK may include two-dimensionally arranged memory cells MC.

Referring to FIG. 2A, the memory block BLK includes a plurality of memory strings MS, and the plurality of memory strings MS are coupled between bit lines BL1 to BLm and a common source line CSL. Each of the memory strings MS includes at least one drain select transistor DST, at least one dummy transistor DT, a plurality of memory cells MC, at least one dummy transistor DT, and at least one source select transistor SST, which are coupled in series. Here, m is an integer of 2 or more.

Gate electrodes of the memory cells MC are coupled to word lines WL. Word line voltages (e.g., a program voltage, a pass voltage, a read voltage, and the like) necessary for driving the word lines WL may be applied to each of the word lines WL. Gate electrodes of the dummy transistors DT are coupled to dummy word lines DWL. Word line voltages or a dummy word line voltage may be applied to each of the dummy word lines DWL. Gate electrodes of the drain select transistors DST are coupled to a drain select line DSL. Gate electrodes of the source select transistors SST are coupled to a source select line SSL.

According to the above-described structure, memory cells MC coupled to the same word line WL to be simultaneously programmed may constitute one page, and one memory block BLK may include a plurality of pages.

FIG. 2B illustrates an embodiment in which memory strings MS are three-dimensionally arranged. A cell array may include a plurality of memory blocks, and each memory block BLK may include three-dimensionally arranged memory cells MC.

Referring to FIG. 2B, the memory block BLK includes a plurality of memory strings MS11 to MS1*m* and MS21 to MS2*m*. Each of the memory strings MS11 to MS1*m* and MS21 to MS2*m* may extend along a +Z direction. The +Z direction may be a direction in which memory cells MC are stacked.

Each of the memory strings MS11 to MS1*m* and MS21 to MS2*m* may include at least one source select transistor SST, at least one dummy transistor DT, a plurality of memory cells MC, at least one dummy transistor DT, and at least one drain select transistor DST, which are sequentially stacked. The dummy transistor DT may have a structure similar to that of the memory cell MC. For example, the dummy transistor DT may include a memory layer for storing data, and the memory layer may include a tunnel insulating layer, a data storage layer, and a charge blocking layer.

The number and positions of dummy transistors DT in each of the memory strings MS11 to MS1*m* and MS21 to MS2*m* may be changed. For example, each of the memory strings MS11 to MS1*m* and MS21 to MS2*m* may include the dummy transistor DT only between the memory cells MC and the source select transistor SST, or include the dummy transistor DT only between the memory cells MC and the drain select transistor DST. In addition, the number of dummy transistors DT located at a source side may be equal to or different from the number of dummy transistors DT located at a drain side.

The source select transistors SST in each of the memory strings MS11 to MS1*m* and MS21 to MS2*m* may be coupled in series between the dummy transistors DT and a common source line CSL. In addition, source select transistors SST at the same level may be coupled to the same source select line SSL.

Source-side dummy transistors DT in each of the memory strings MS11 to MS1*m* and MS21 to MS2*m* may be coupled in series between the memory cells MC and the source select transistors SST. Drain-side dummy transistors DT in each of the memory strings MS11 to MS1*m* and MS21 to MS2*m* may be coupled in series between the memory cells MC and the drain select transistors DST. In addition, dummy transistors DT at the same level may be coupled to the same dummy word line DWL.

The memory cells MC in each of the memory strings MS11 to MS1*m* and MS21 to MS2*m* may be coupled in series between the source-side dummy transistor DT and the drain-side dummy transistor DT. In addition, memory cells MC at the same level may be coupled to the same word line WL.

The drain select transistors DST in each of the memory strings MS11 to MS1*m* and MS21 to MS2*m* may be coupled in series between bit lines BL1 to BLm and the dummy transistors DT. Drain select transistors DST at the same level among the drain select transistors DST of the memory strings MS11 to MS1*m* and MS21 to MS2*m*, which are arranged on the same row (in a +X direction), may be coupled to the same drain select line DSL. In addition, drain select transistors DST arranged on different rows (in the +X direction) may be coupled to different drain select lines DSL.

FIG. 2C illustrates an embodiment in which memory strings MS are three-dimensionally arranged. A cell array may include a plurality of memory blocks, and each memory block BLK may include three-dimensionally arranged memory cells MC.

Referring to FIG. 2C, the memory block BLK includes a plurality of memory strings MS11 to MS1*m* and MS21 to MS2*m*. Each of the memory strings MS11 to MS1*m* and MS21 to MS2*m* may include at least one source select transistor SST, at least one dummy transistor DT, a plurality of memory cells MC, at least one pipe transistor PT, a plurality of memory cells MC, at least one dummy transistor DT, and at least one drain select transistor DST, which are coupled in series. Each of the memory strings MS11 to MS1*m* and MS21 to MS2*m* may be arranged in a 'U' shape.

The pipe transistor PT couples drain-side memory cells MC and source-side memory cells MC to each other. In addition, a gate of the pipe transistor PT of each of the memory strings MS11 to MS1*m* and MS21 to MS2*m* may be coupled to a pipe line PL.

The remaining structure is similar to that described with reference to FIG. 2B, and overlapping descriptions will be omitted.

FIG. 3 is a flowchart illustrating an operating method of a semiconductor device according to an embodiment of the present disclosure, for example, the semiconductor device 100 of FIG. 1. The semiconductor device 100 may include the cell array 110 described with reference to FIGS. 2A to 2C. For example, a memory string may include a plurality of memory cells MC, a plurality of select transistors DST and SST, and at least one dummy transistor DT coupled between the plurality of memory cells MC and the plurality of select transistors DST and SST.

Referring to FIG. 3, a program voltage is applied to a selected dummy word line DWL among a plurality of dummy word lines DWL respectively coupled to a plurality of dummy transistors DT (S310). In addition, a dummy word line voltage is applied to select lines (i.e., drain select line DSL and source select line SSL) adjacent to the dummy word line among a plurality of select lines DSL and SSL respectively coupled to the plurality of select transistors DST and SST (S320). The steps S310 and S320 may be simultaneously or sequentially performed.

A pass voltage may be applied to word lines WL, and the dummy word line voltage may be applied to unselected dummy word lines DWL. The dummy word line voltage may have a level lower than that of the pass voltage. In addition, a ground voltage may be applied to the other select lines DSL and SSL.

According to the operating method described above, real data may be programmed to dummy transistors DT corresponding to the dummy word line DWL. Thus, the capacity of the memory block BLK may be increased, and the manufacturing cost of the semiconductor device may be reduced. Further, select lines DSL and SSL adjacent to the dummy word line DWL among the plurality of select lines DSL and SSL may be replaced with dummy word lines. Thus, a substantial number of dummy word lines DWL may be maintained, and the reliability of data may be ensured.

FIG. 4 is a diagram illustrating a portion of a memory string MS of a semiconductor device according to an embodiment of the present disclosure, for example, the semiconductor device 100 of FIG. 1.

Referring to FIG. 4, the memory string MS may include a plurality of memory cells MC, a plurality of source select transistors SST1 and SST2, and at least one of dummy transistors DT1 to DT3, which are coupled between the memory cells MC and the source select transistors SST1 and SST2. Although an example in which first to third dummy transistors DT1 to DT3 are coupled between the memory cells MC and the source select transistors SST1 and SST2 is illustrated, the present disclosure is not limited thereto, and the number of dummy transistors DT1 to DT3 may be changed.

Figure 5A:
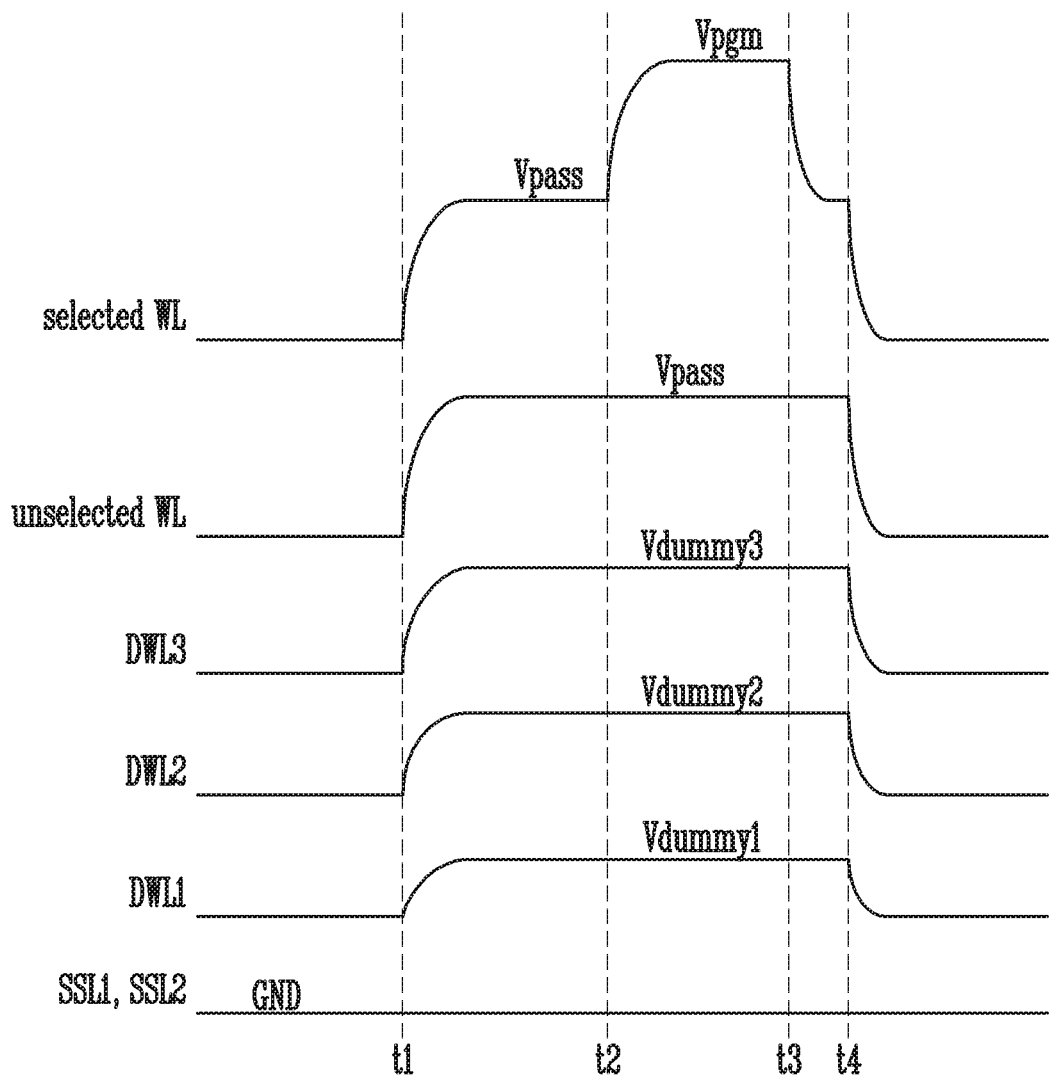
FIGS. 5A and 5B are diagrams illustrating waveforms of pulses used in a program operation.
Figure 5B:
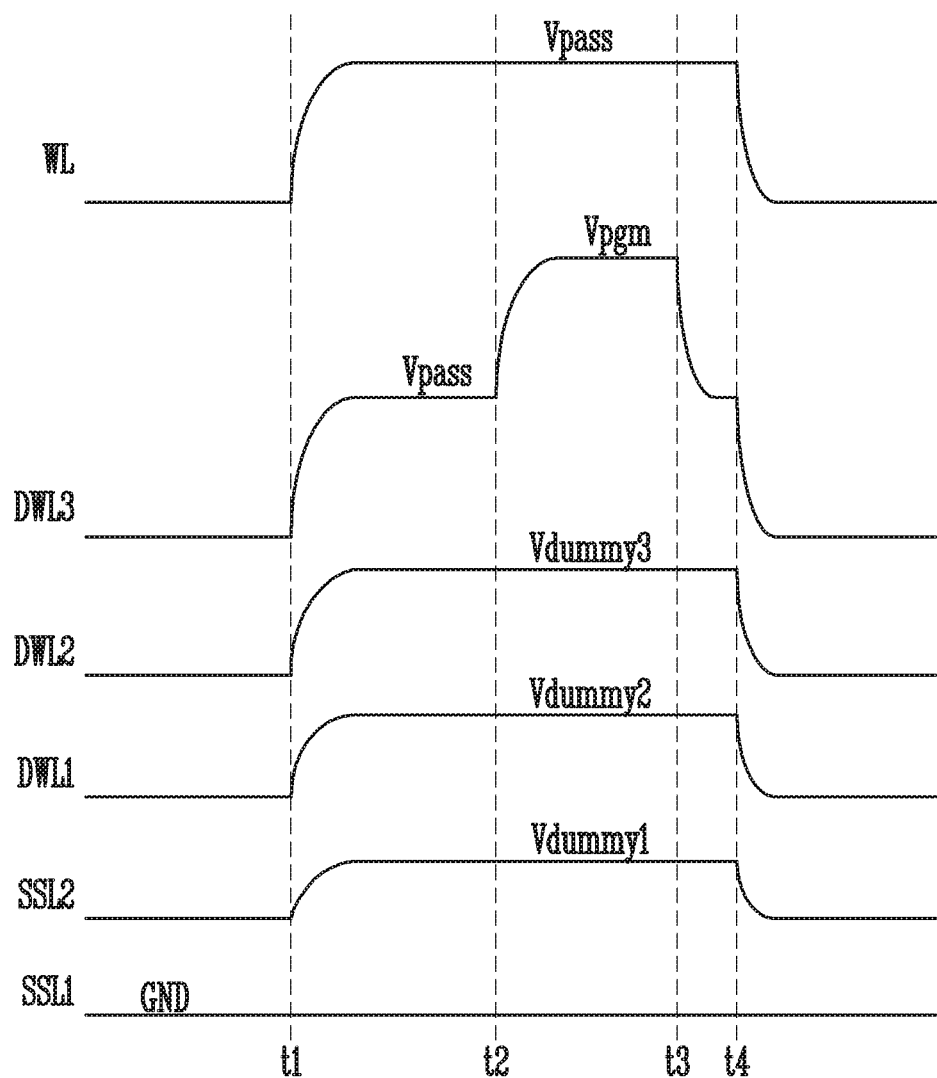

FIGS. 5A and 5B are diagrams illustrating waveforms of pulses used in a program operation of a semiconductor device. For example, the program operation of FIGS. 5A and 5B may be performed by the semiconductor device 100 of FIG. 1 including a memory string MS of FIG. 4. FIG. 5A illustrates an example in which the program operation is performed on memory cells corresponding to a word line, and FIG. 5B illustrates an example in which the program operation is performed on dummy transistors corresponding to a dummy word line.

Referring to FIGS. 4 and 5A, at a first time t1, a pass voltage Vpass is applied a selected word line selected WL and unselected word lines unselected WL among a plurality of word lines WL. A ground voltage GND is applied to first and second source select lines SSL1 and SSL2. In addition, first to third dummy word line voltages Vdummy1 to Vdummy3 are applied to first to third dummy word lines DWL1 to DWL3, respectively.

The first to third dummy word line voltages Vdummy1 to Vdummy3 may have a level lower than that of the pass voltage Vpass. The first to third dummy word line voltages Vdummy1 to Vdummy3 may have different voltage levels from each other. The corresponding voltage levels may be greater as the corresponding dummy word lines DWL1 to DWL3 become closer to the word lines WL. In other words, voltages applied to gates of first to third dummy transistors DT1 to DT3 may have different voltage levels from each other. The corresponding voltage levels may be smaller as the first to third dummy transistors DT1 to DT3 become closer to the source select transistors SST1 and SST2 (i.e., Vdummy1<Vdummy2<Vdummy3). For example, the first dummy word line voltage Vdummy1 may be about 3 V, the second dummy word line voltage Vdummy2 may be about 6 V, and the third dummy word line voltage Vdummy3 may be about 9V.

At a second time t2, the unselected word lines unselected WL maintain the pass voltage Vpass, while the selected word line selected WL is biased with a program voltage Vpgm having a voltage level higher than the pass voltage Vpass. The first to third dummy word lines DWL1 to DWL3 maintain the first to third dummy word line voltages Vdummy1, Vdummy2, and Vdummy3, respectively. The first and second source select lines SSL1 and SSL2 maintain the ground voltage GND.

At a third time t3, the program voltage Vpgm applied to the selected word line selected WL is discharged to the pass voltage Vpass. At a fourth time t4, the dummy word lines DWL1 to DWL3 and the word lines WL are discharged to the ground voltage GND, and the program operation is ended.

As described above, the first to third dummy word line voltages Vdummy1 to Vdummy3 having a bias gradient are applied to the first to third dummy word lines DWL1 to DWL3, so that the potential of a channel layer of the memory string MS may be prevented from being rapidly changed. That is, the potential of the channel layer may be gradually decreased between the memory cell MC and the source select transistor SST.

Referring to FIGS. 4 and 5B, at a first time t1, the pass voltage Vpass is applied to a selected dummy word line DWL3 among the dummy word lines DWL and the word lines WL. The ground voltage GND is applied to the first source select line SSL1. In addition, the first to third dummy word line voltages Vdummy1 to Vdummy3 are applied to the source select line SSL2 adjacent to the dummy word lines DWL1 to DWL3 and unselected dummy word lines DWL1 and DWL2, respectively.

The first to third dummy word line voltages Vdummy1 to Vdummy3 may have a level lower than that of the pass voltage Vpass. The dummy word line voltage Vdummy1 applied to the adjacent source select line SSL2 may have a level lower than that of the respective dummy word line voltages Vdummy2 and Vdummy3 applied to the unselected dummy word lines DWL1 and DWL2.

The first to third dummy word line voltages Vdummy1 to Vdummy3 may have different voltage levels from each other. The corresponding voltage levels may be greater as the corresponding lines SSL2, DWL1 and DWL2 become closer to the word lines WL. In other words, the voltages applied to the gates of the second dummy transistor DT2, the first dummy transistor DT1, and the second source select transistor SST2 may have different voltage levels from each other. The corresponding voltage levels may be smaller as the second dummy transistor DT2, the first dummy transistor DT1, and the second source select transistor SST2 become closer to the first source select transistor SST1 (i.e., Vdummy1<Vdummy2<Vdummy3). For example, the first dummy word line voltage Vdummy1 may be about 2 V, the second dummy word line voltage Vdummy2 may be about 5 V, and the third dummy word line voltage Vdummy3 may be about 8 V.

At a second time t2, the word lines WL maintain the pass voltage Vpass, while the selected dummy word line DWL3 is biased with a program voltage Vpgm having a voltage level higher than the pass voltage Vpass. The second source select line SSL2 and the first and second dummy word lines DWL1 and DWL2 maintain the first to third dummy word line voltages Vdummy1, Vdummy2, and Vdummy3, respectively. The first source select line SSL1 maintains the ground voltage GND.

At a third time t3, the program voltage Vpgm applied to the selected dummy word line DWL3 is discharged to the pass voltage Vpass. At a fourth time t4, the dummy word lines DWL1 to DWL3, the word lines WL, and the second source select line SSL2 are discharged to the ground voltage GND, and the program operation is ended.

As described above, the program voltage Vpgm is applied to the dummy word line DWL3, so that real data may be programmed to dummy transistors corresponding to the dummy word line DWL3. Thus, the capacity of a corresponding memory block may be increased. Further, the second source select line SSL2 adjacent to the dummy word lines DWL1 to DWL3 is replaced with a dummy word line, so that the existing number of dummy word lines may be maintained. Thus, the potential of the channel layer of the memory string MS may be prevented from being rapidly changed.

Difference values between the first to third dummy word line voltages Vdummy1 to Vdummy3 may be equal to or different from each other. For example, when the difference value (i.e., Vdummy3−Vdummy2) between the third dummy word line voltage Vdummy3 and the second dummy word line voltage Vdummy2 is d2, and the difference value (i.e., Vdummy2−Vdummy1) between the second dummy word line voltage Vdummy2 and the first dummy word line voltage Vdummy1 is d1, d2 and d1 may be equal to or different from each other.

In addition, the maximum value of a dummy word line voltage used when the dummy word line DWL3 is selected may be lower than that of a dummy word line voltage used when the word line WL is selected. For example, the maximum value of the dummy word line voltage used when the dummy word line DWL3 is selected may be 8 V, and the maximum value of the dummy word line voltage used when the word line WL is selected may be 9 V.

Figure 6:
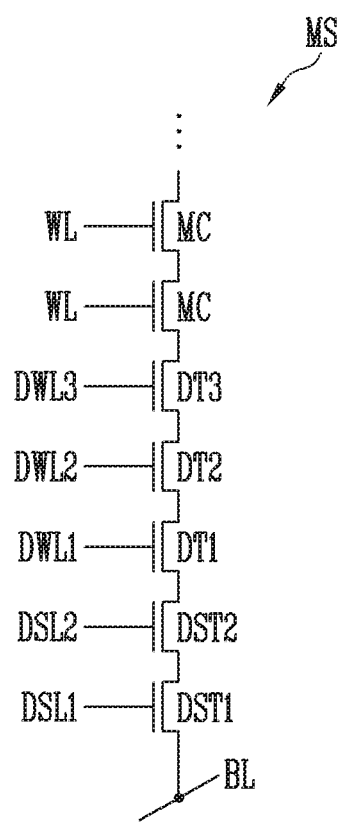
FIG. 6 is a diagram illustrating a portion of a memory string of a semiconductor device according to an embodiment of the present disclosure.

FIG. 6 is a diagram illustrating a portion of a memory string MS of a semiconductor device according to an embodiment of the present disclosure, for example, the semiconductor device 100 of FIG. 1.

Referring to FIG. 6, the memory string MS may include a plurality of memory cells MC, a plurality of drain select transistors DST1 and DST2, and at least one of dummy transistors DT1 to DT3, which are coupled between the memory cells MC and the drain select transistors DST1 and DST2. Although a case where first to third dummy transistors DT1 to DT3 are coupled between the memory cells MC and the drain select transistors DST1 and DST2 is illustrated in this embodiment, the present disclosure is not limited thereto, and the number of dummy transistors DT1 to DT3 may be changed.

Figure 7A:
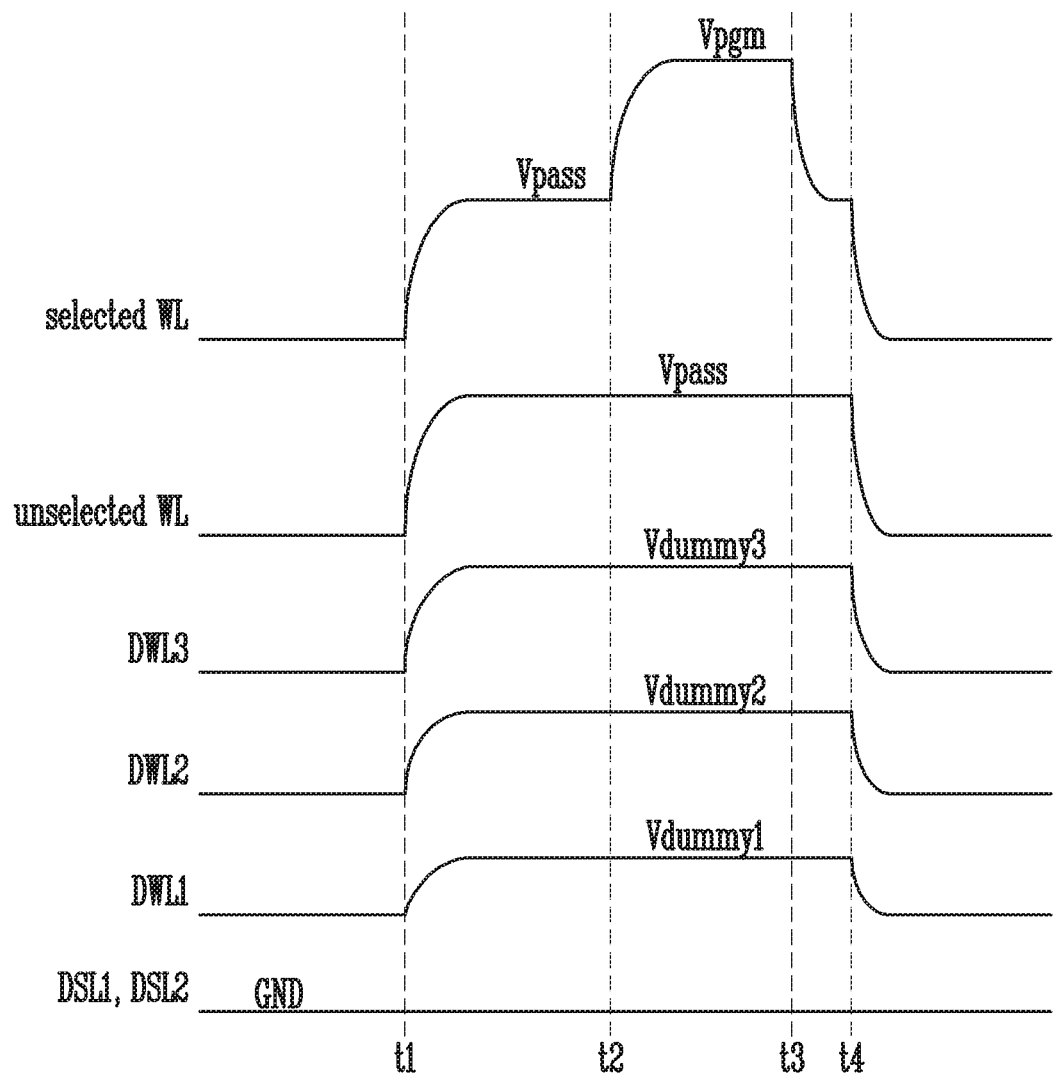

FIGS. 7A and 7B are diagrams illustrating waveforms of pulses used in a program operation of a semiconductor device. For example, the program operation of FIGS. 7A and 7B may be performed by the semiconductor device 100 of FIG. 1 including a memory string MS of FIG. 6. FIG. 7A illustrates a case where the program operation is performed on memory cells corresponding to a word line, and FIG. 7B illustrates a case where the program operation is performed on dummy transistors corresponding to a dummy word line. Hereinafter, descriptions of contents overlapping with those described above will be omitted.

Referring to FIGS. 6 and 7A, at a first time t1, a pass voltage Vpass is applied to a selected word line selected WL and unselected word lines unselected WL among a plurality of word lines WL. A ground voltage GND is applied to first and second drain select lines DSL1 and DSL2. In addition, first to third dummy word line voltages Vdummy1 to Vdummy3 are applied to first to third dummy word lines DWL1 to DWL3, respectively. The first to third dummy word line voltages Vdummy1 to Vdummy3 may have different voltage levels from each other. The corresponding voltage levels may be greater as the corresponding dummy word lines DWL1 to DWL3 become closer to the word lines WL (i.e., Vdummy1<Vdummy2<Vdummy3).

At a second time t2, the unselected word lines unselected WL maintain the pass voltage Vpass, while the selected word line selected WL is biased with a program voltage Vpgm having a voltage level higher than the pass voltage Vpass. The first to third dummy word lines DWL1 to DWL3 maintain the first to third dummy word line voltages Vdummy1, Vdummy2, and Vdummy3, respectively. The first to second drain select lines DSL1 and DSL2 maintain the ground voltage GND.

At a third time t3, the program voltage Vpgm applied to the selected word line selected WL is discharged to the pass voltage Vpass. At a fourth time t4, the dummy word lines DWL1 to DWL3 and the word lines WL are discharged to the ground voltage GND, and the program operation is ended.

Referring to FIGS. 6 and 7B, at a first time t1, the pass voltage Vpass is applied to a selected dummy word line DWL3 among dummy word lines DWL and the word lines WL. The ground voltage GND is applied to the first drain select line DSL1. In addition, the first to third dummy word line voltages Vdummy1 to Vdummy3 are applied to unselected dummy word lines DWL2 and DWL1 and the drain select line DSL2 adjacent to the dummy word lines DWL1 to DWL3, respectively. The first to third dummy word line voltages Vdummy1 to Vdummy3 may have different voltage levels from each other. The corresponding voltage levels may be greater as the corresponding lines DWL1, DWL2, and DSL2 become closer to the word lines WL (i.e., Vdummy1<Vdummy2<Vdummy3).

At a second time t2, the word lines WL maintain the pass voltage Vpass, while the selected dummy word line DWL3 is biased with a program voltage Vpgm having a voltage level higher than the pass voltage Vpass. The second drain select line DSL2 and the first and second dummy word lines DWL1 and DWL2 maintain the first to third dummy word line voltages Vdummy1, Vdummy2, and Vdummy3, respectively. The first drain select line DSL1 maintains the ground voltage GND.

At a third time t3, the program voltage Vpgm applied to the selected dummy word line DWL3 is discharged to the pass voltage Vpass. At a fourth time t4, the dummy word lines DWL1 to DWL3, the word lines WL, and the second drain select line DSL2 are discharged to the ground voltage GND, and the program operation is ended.

Figure 8:
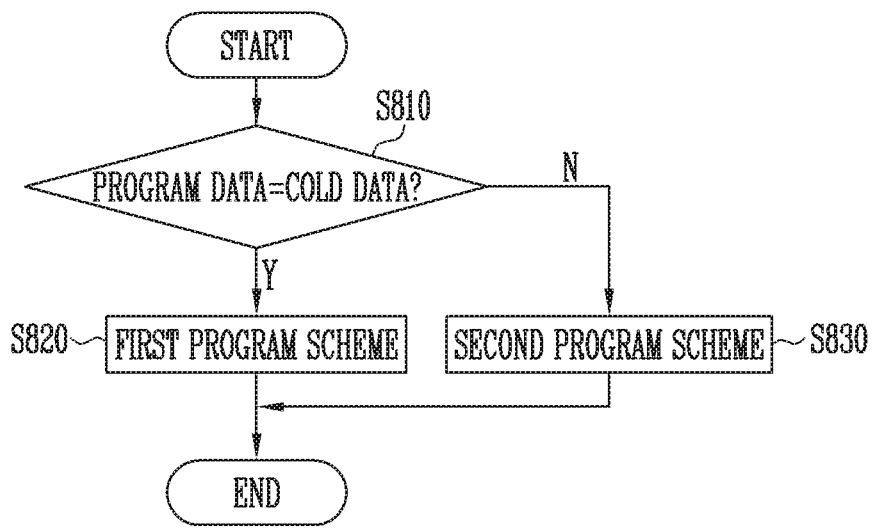
FIG. 8 is a flowchart illustrating an operating method of a semiconductor device according to an embodiment of the present disclosure.

FIG. 8 is a flowchart illustrating an operating method of a semiconductor device according to an embodiment of the present disclosure, for example, the semiconductor device 100 of FIG. 1.

Referring to FIG. 8, it is determined whether data to be programmed is hot data or cold data (S810). In various embodiments, the cold data and the hot data may be sorted according to a kind of data, a frequency of update operation, and a frequency of write access. For example, data having a relatively low frequency of update operation may be sorted as cold data, and data having a relatively high frequency of update operation may be sorted as hot data. Alternatively, data having a relatively low frequency of write access may be sorted as cold data, and data having a relatively high frequency of write access frequency may be sorted as hot data.

When it is determined that the data is sorted as the cold data (S810, Y), a program operation is performed using a first program scheme (S820). The first program scheme may be the scheme described with reference to FIGS. 4 to 7B. For example, one of word lines and at least one dummy word line of a corresponding memory block is selected, and a program voltage is applied to the selected word line or the selected dummy word line. When the program voltage is applied to the dummy word line, a dummy word line voltage is applied to a select line adjacent to the dummy word line. Accordingly, the program operation may be performed on a memory cell and real data may be stored in the memory cell (Refer to FIGS. 5A and 7A.) Alternately, the program operation may be performed on a dummy transistor and data may be stored in the dummy transistor (Refer to FIGS. 5B and 7B.)

When it is determined that the data is sorted as the hot data (S810, N), the program operation is performed using a second program scheme (S830). The second program scheme may be the scheme described with FIGS. 4, 5A, 6, and 7A. For example, one of word lines of a corresponding memory block is selected, and a program voltage is applied to the selected word line. Accordingly, the program operation may be performed on a memory cell, and real data may be stored in only the memory cell (Refer to FIGS. 5A and 7A.)

According to the operation described above, a program scheme is determined according to the kind of data, and the program operation on the dummy transistor is performed only when the data is sorted as the cold data. Thus, degradation of cycling characteristics due to programming of the dummy transistor may be minimized. That is, the data capacity of the memory block may be increased, and the degradation of cycling characteristics may be minimized.

In various embodiments, the above-described operating method may be applied to a garbage collection operation. When data write and delete operations of the semiconductor device are repeated, a garbage area in which invalid data is stored in a memory area is increased, and hence an available space to which data may be allocated becomes insufficient. Thus, in a memory block including valid pages and invalid pages, the valid pages are copied to another memory block, and data of the corresponding memory block is deleted, so that a free block may be generated. Accordingly, an area in which invalid data is stored may be changed into a free area to be reused.

According to an embodiment of the present disclosure, in a process of copying valid data to another memory block in the garbage collection operation, it is determined whether the valid data is the cold data or the hot data (S810).

When it is determined that the valid data is sorted as the cold data (S810, Y), the program operation is performed using the first program scheme (S820). For example, the program voltage is applied to the selected word line or the selected dummy word line, so that the program operation is performed on the corresponding memory cell or the corresponding dummy transistor. In addition, when the program voltage is applied to the dummy word line, the dummy word line voltage is applied to a select line adjacent to the dummy word line. Accordingly, real data may be stored in the memory cell or the dummy transistor.

When it is determined that the valid data is sorted as the hot data (S810, N), the program operation is performed using the second program scheme (S830). For example, the program voltage is applied to the selected word line, so that the program operation is performed on the corresponding memory cell. That is, real data is stored in only the memory cell.

According to this scheme, the available space may be further enlarged through the garbage collection operation.

Figure 9:
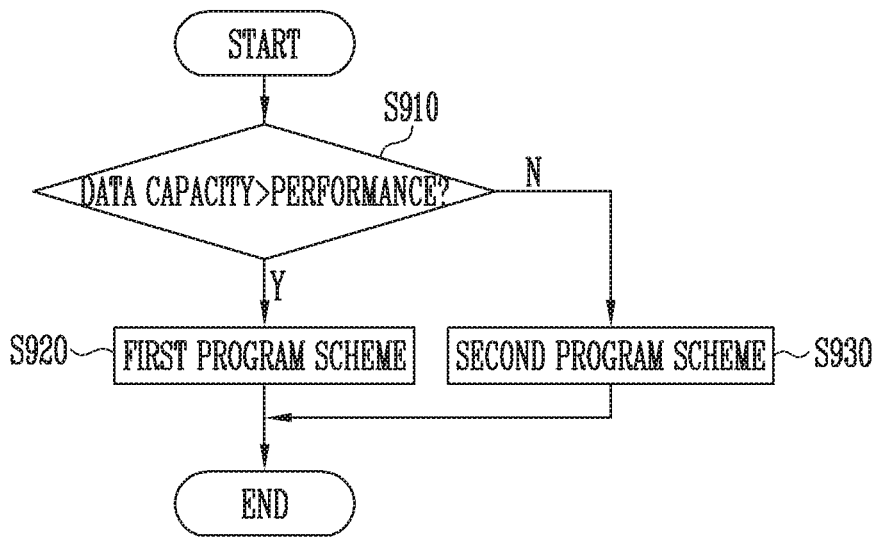
FIG. 9 is a flowchart illustrating an operating method of a semiconductor device according to an embodiment of the present disclosure.

FIG. 9 is a flowchart illustrating an operating method of a semiconductor device according to an embodiment of the present disclosure, for example, the semiconductor device 100 of FIG. 1.

Referring to FIG. 9, an order of priority of performance and data capacity is determined according to usage of the memory device (S910). When it is determined that the priority of the data capacity is higher than that of the performance (S910, Y), a program operation is performed using a first program scheme (S920). The first program scheme may be the scheme described with FIGS. 4 to 7B. For example, one of word lines and at least one dummy word line of a corresponding memory block is selected, and a program voltage is applied to the selected word line or the selected dummy word line. When the program voltage is applied to the dummy word line, a dummy word line voltage is applied to a select line adjacent to the dummy word line. Accordingly, the program operation may be performed on a memory cell or a dummy transistor, and real data may be stored in the memory cell or the dummy transistor.

When it is determined that the priority of the performance is higher than that of the data capacity (S910, N), the program operation is performed using a second program scheme (S930). The second program scheme may be the scheme described with FIGS. 4, 5A, 6, and 7A. For example, one of word lines of a corresponding memory block is selected, and a program voltage is applied to the selected word line. Accordingly, the program operation may be performed on a memory cell, and data may be stored in only the memory cell.

Figure 10:
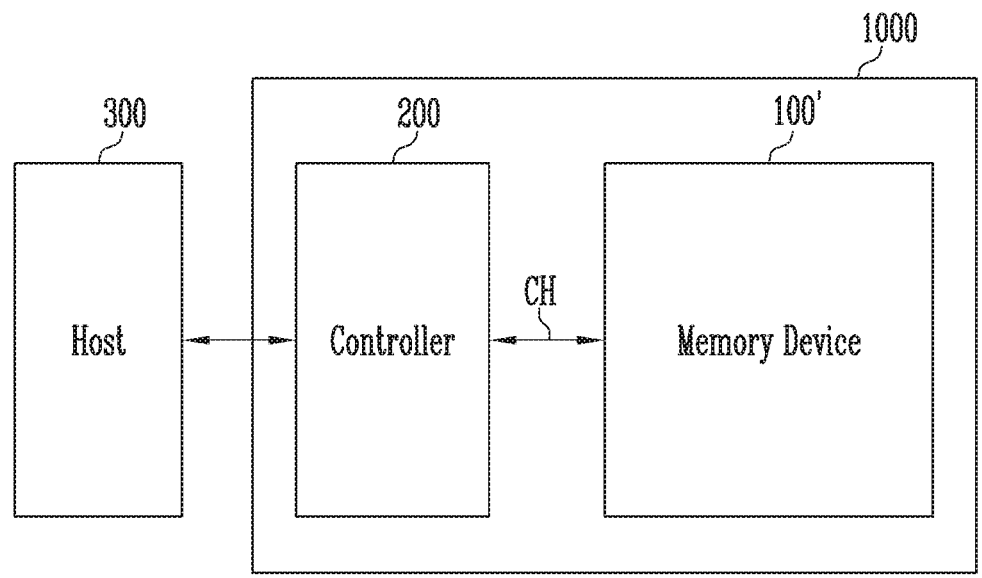
FIG. 10 is a block diagram illustrating a memory system according to an embodiment of the present disclosure.

FIG. 10 is a block diagram illustrating a memory system 1000 according to an embodiment of the present disclosure.

Referring to FIG. 10, the memory system 1000 includes a memory device 100' and a controller 200.

The controller 200 controls the memory device 100' through a channel CH, and the memory device 100' operates under the control of the controller 200. The memory device 100' includes a memory cell array having a plurality of memory blocks. In an embodiment, the memory device 100' may be the semiconductor device 100 described above, and be a flash memory device.

The controller 200 controls the memory device 100' in response to a request from a host 300. In addition, the memory device 100' receives a command and an address from the controller 200 through the channel CH, and accesses an area selected by the address in the memory cell array. That is, the memory device 100' performs an internal operation corresponding to the command on the area selected by the address.

The controller 200 may control the memory device 100' to perform a program operation, a read operation, an erase operation, or the like. In the program operation, the controller 200 provides the memory device 100' with a program command, an address, data, and the like through the channel CH, and the memory device 100' programs the data in an area selected by the address. In the erase operation, the controller 200 provides the memory device 100' with an erase command, an address, and the like through the channel CH, and the memory device 100' erases data stored in an area selected by the address. In the read operation, the controller 200 provides the memory device 100' with a read command, an address, and the like through the channel CH, and the memory device 100' reads data from an area selected by the address. The read operation includes not only a read operation for reading and outputting data stored in a memory cell but also a read operation as a verify operation accompanied by the program or erase operation.

When a program operation is performed, the controller 200 may efficiently manage an available space of data area. For example, when a write operation is requested from the host 300, the controller 200 commands the memory device 100' to perform the program operation, using the scheme described with reference to FIGS. 3 to 9.

For example, in a program operation, the controller 200 controls the memory device 100' to apply a program voltage to a dummy word line and apply a dummy word line voltage to a select line adjacent to the dummy word line among a plurality of select lines. In a garbage collection operation, the controller 200 may sort program data as cold data or hot data, and control the memory device 100' to, when the cold data is programmed in a memory block, select one of word lines and a dummy word line of the corresponding memory block and apply the program voltage to the selected line. Also, the controller 200 determines an order of priority of performance and data capacity according to usage of the memory device 100', and control the memory device 100' to, when the priority of the data capacity is higher than that of the performance, select one of word lines and a dummy word line of the corresponding memory block and apply the program voltage to the selected line.

According to this scheme, the data capacity of the memory device 100' per memory block may be increased. Further, the bias gradient of dummy word lines is maintained by maintaining a substantial number of dummy word lines, so that the reliability of data may be ensured.

Figure 11:
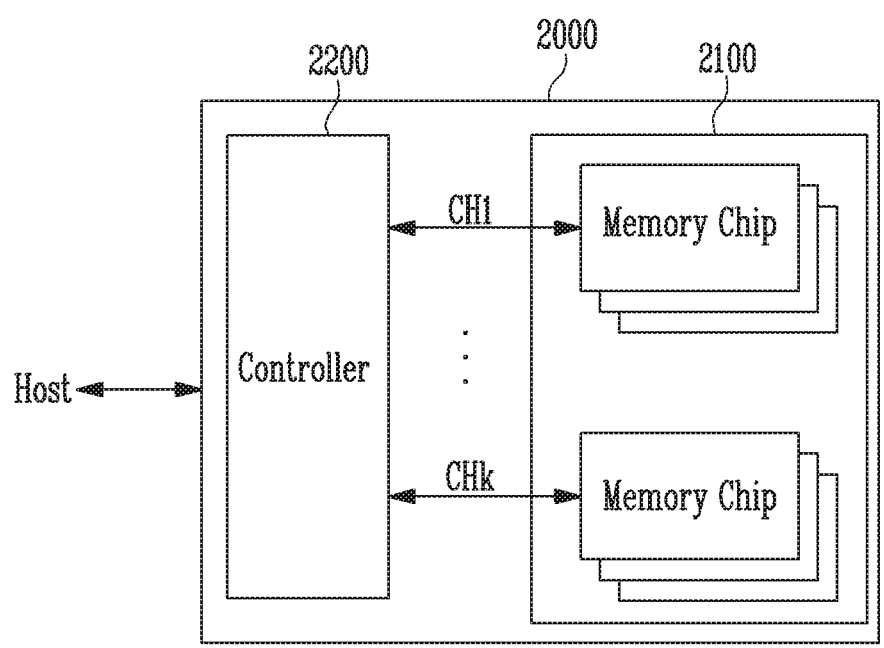
FIG. 11 is a block diagram illustrating a memory system according to an embodiment of the present disclosure.

FIG. 11 is a block diagram illustrating a memory system 2000 according to an embodiment of the present disclosure.

Referring to FIG. 11, the memory system 2000 includes a memory device 2100 and a controller 2200.

The memory device 2100 may be a semiconductor device, and include a plurality of memory chips. The plurality of memory chips is divided into a plurality of groups. The plurality of groups communicates with the controller 2200 respectively through first to kth channels CH1 to CHk. Each memory chip may be configured and operated similarly to the semiconductor device 100 described with reference to FIG. 1.

Each group communicates with the controller 2200 through one common channel. The controller 2200 is configured identically to the controller 200 described with reference to FIG. 10. The controller 2200 controls the plurality of memory chips of the memory device 2100 through the plurality of channels CH1 to CHk. The memory system 2000 may be modified such that one memory chip is coupled to one channel.

The controller 2200 and the memory device 2100 may be integrated into a single semiconductor device. In an embodiment, the controller 2200 and the memory device 2100 may be integrated into a single semiconductor device to constitute a memory card. For example, the controller 2200 and the memory device 2100 may be integrated into a single semiconductor device to constitute a memory card such as a PC card (e.g., Personal Computer Memory Card International Association (PCMCIA) card), a Compact Flash (CF) card, a Smart Media Card (e.g., SM and SMC), a memory stick, a Multi-Media Card (e.g., MMC, RS-MMC, MMC-micro and eMMC), an secure digital (SD) card (e.g., SD, miniSD, microSD and SDHC), and a Universal Flash Storage (UFS).

The controller 2200 and the memory device 2100 may be integrated into one semiconductor device to constitute a semiconductor drive (e.g., solid state drive (SSD)). The semiconductor drive SSD includes a storage device configured to store data in a semiconductor memory. When the memory system 2000 is used as the semiconductor drive SSD, the operating speed of a host Host coupled to the memory system 2000 can be remarkably improved.

In another example, the memory system 2000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

Figure 12:
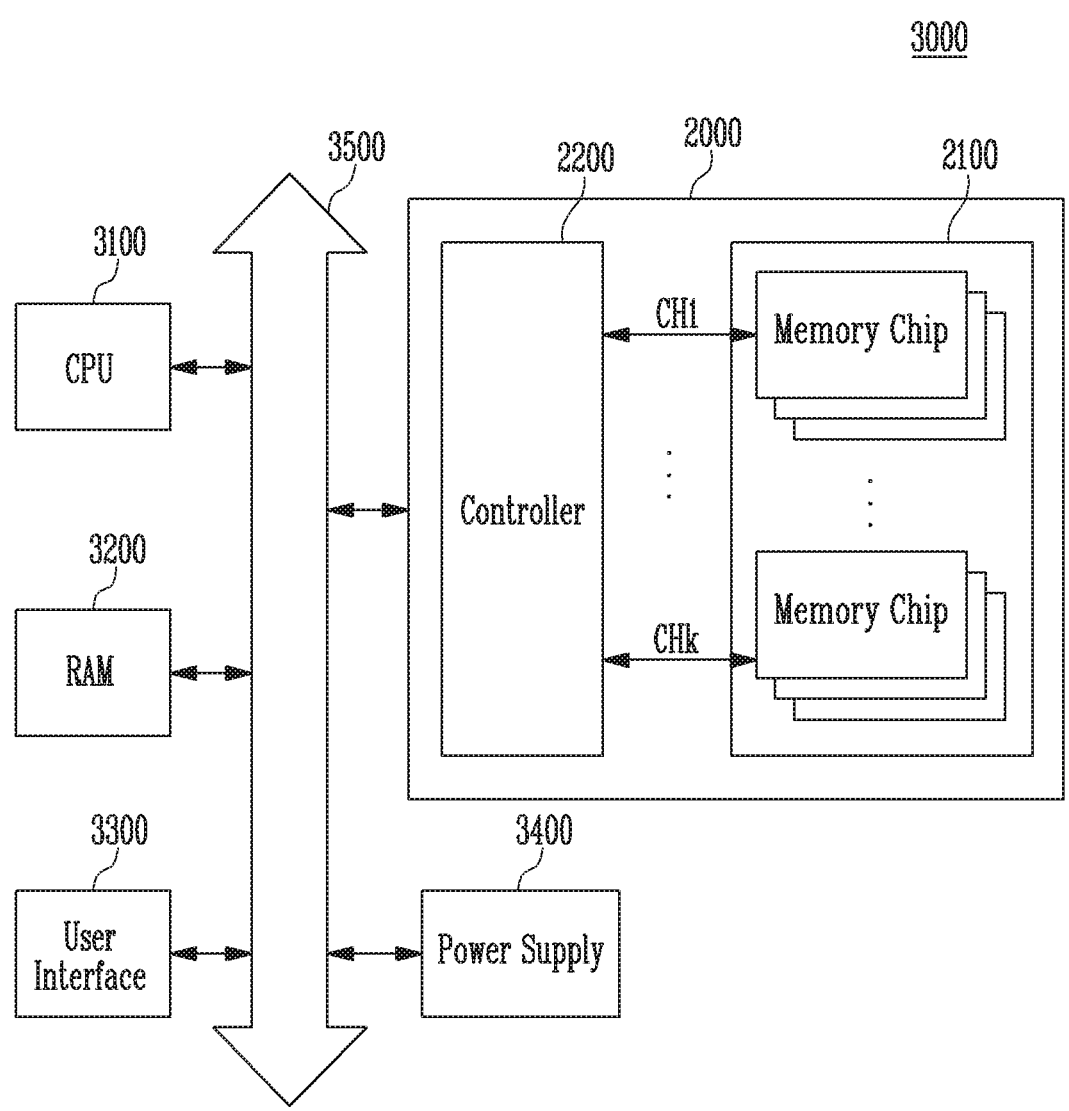
FIG. 12 is a block diagram illustrating a computing system according to an embodiment of the present disclosure.

FIG. 12 is a block diagram illustrating a computing system 3000 according to an embodiment of the present disclosure.

Referring to FIG. 12, the computing system 3000 includes a central processing unit 3100, a random access memory (RAM) 3200, a user interface 3300, a power supply 3400, a system bus 3500, and a memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

A memory device 2100 is coupled to the system bus 3500 through a controller 2200. When the memory device 2100 is directly coupled to the system bus 3500, the function of the controller 2200 may be performed by the central processing unit 3100 and the RAM 3200.

The computing system 3000 may be configured to include the memory system 2000 described with reference to FIG. 11 or to include the memory system 1000 described with reference to FIG. 10. In addition, the computing system 3000 may be configured to include both the memory systems 1000 and 2000 described with reference to FIGS. 10 and 11.

According to the present disclosure, a data capacity per memory block may be increased, and the manufacturing cost of the semiconductor device may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a memory string including a plurality of memory cells, a plurality of select transistors, and one or more dummy transistors coupled between the plurality of memory cells and the plurality of select transistors;
   a plurality of word lines respectively coupled to the plurality of memory cells;
   one or more dummy word lines coupled to the one or more dummy transistors; and
   a plurality of select lines respectively coupled to the plurality of select transistors,
   wherein, when a program voltage is applied to a selected dummy word line among the one or more dummy word lines, a first dummy word line voltage is applied to a select line adjacent to the one or more dummy word lines, among the plurality of select lines.

2. The semiconductor device of claim 1,
   wherein a second dummy word line voltage is applied to one or more unselected dummy word line among the one or more dummy word lines.

3. The semiconductor device of claim 2, wherein the first dummy word line voltage has a level lower than that of the second dummy word line voltage.

4. The semiconductor device of claim 2, wherein the first and second dummy word line voltages have different voltage levels from each other, and each of the different voltage levels is greater as the unselected dummy word line and the select line become closer to the plurality of word lines.

5. The semiconductor device of claim 1, wherein a ground voltage is applied to other select lines in which the first dummy word line voltage is not applied among the plurality of select lines.

6. The semiconductor device of claim 1, wherein, when the program voltage is applied to the selected dummy word line, a pass voltage is applied to the plurality of word lines.

7. The semiconductor device of claim 6, wherein the first dummy word line voltage has a lower voltage level than that of the pass voltage.

8. A method for operating a semiconductor device including a plurality of memory cells, a plurality of select transistors, and a plurality of dummy transistors coupled between the plurality of memory cells and the plurality of select transistors, a plurality of word lines respectively coupled to the plurality of memory cells, a plurality of dummy word lines respectively coupled to the plurality of dummy transistors, and a plurality of select lines respectively coupled to the plurality of select transistors, the method comprising:
   applying a program voltage to a selected dummy word line among the plurality of dummy word lines; and
   applying a first dummy word line voltage to a select line adjacent to the plurality of dummy word lines, among the plurality of select lines.

9. The method of claim 8, further comprising applying a second dummy word line voltage to one or more unselected dummy word lines among the plurality of dummy word lines.

10. The method of claim 9, wherein the first dummy word line voltage has a level lower than that of the second dummy word line voltage.

11. The method of claim 9, wherein the first and second dummy word line voltages have different voltage levels from each other, and each of the different voltage levels is greater as the unselected dummy word line and the select line become closer to the plurality of word lines.

12. The method of claim 8, further comprising:
   applying a pass voltage to the plurality of word lines respectively coupled to the plurality of memory cells; and
   applying a ground voltage to other select lines in which the first dummy word line voltage is not applied among the plurality of select lines.

13. The method of claim 12, wherein the first dummy word line voltage has a voltage level lower than that of the pass voltage.

14. A memory system comprising:
   a memory device including a memory string including a plurality of memory cells, a plurality of select transistors, and one or more dummy transistors coupled between the plurality of memory cells and the plurality of select transistors, a plurality of word lines respectively coupled to the plurality of memory cells, one or more dummy word lines coupled to the one or more dummy transistors, and a plurality of select lines respectively coupled to the plurality of select transistors; and
   a controller configured to, in a program operation, control the memory device to apply a program voltage to a selected dummy word line among the one or more dummy word lines, and apply a first dummy word line voltage to a select line adjacent to the one or more dummy word lines, among the plurality of select lines.

15. The memory system of claim 14, wherein the controller determines whether program data is cold data or hot data, and controls the memory device to, when it is determined that the program data is the cold data, select a line among the plurality of word lines and the one or more dummy word lines and apply the program voltage to the selected line.

16. The memory system of claim 15, wherein, in a garbage collection operation, the controller determines valid data as the cold data or the hot data.

17. The memory system of claim 15, wherein the controller controls the memory device to, when it is determined that the program data is the hot data, select a line among the plurality of word lines and apply the program voltage to the selected line.

18. The memory system of claim 14, wherein the controller determines an order of priority of performance and data capacity according to usage of the memory device, and controls the memory device to, when a priority of the data capacity is higher than a priority of the performance, select a line among the plurality of word lines and the one or more dummy word lines and apply the program voltage to the selected line.

19. The memory system of claim 18, wherein the controller controls the memory device to, when a priority of the performance is higher that a priority of the data capacity, select a line among the plurality of word lines and apply the program voltage to the selected line.

\* \* \* \* \*